United States Patent [19]
Penniman et al.

[11] Patent Number: 5,673,176
[45] Date of Patent: Sep. 30, 1997

[54] INTEGRATED CIRCUIT DUAL COOLING PATHS AND METHOD FOR CONSTRUCTING SAME

[75] Inventors: Mark B. Penniman, Austin, Tex.; Peter N. Skillman, San Carlos, Calif.; Tony J. Lillios; Dennis J. Boyle, both of Palo Alto, Calif.

[73] Assignee: Dell USA, L.P., Round Rock, Tex.

[21] Appl. No.: 571,703

[22] Filed: Dec. 6, 1995

[51] Int. Cl.[6] .................................................. H05K 7/20
[52] U.S. Cl. ............................ 361/687; 361/704; 361/719; 361/720; 257/718
[58] Field of Search .................... 165/80.2, 80.3, 165/185; 174/16.3; 257/718, 719, 726, 727; 361/687, 690, 704, 707–712, 715–722

[56] References Cited

U.S. PATENT DOCUMENTS

| | | | |
|---|---|---|---|
| 5,424,913 | 6/1995 | Swindler | 361/687 |
| 5,424,919 | 6/1995 | Hielbronner | 361/710 |
| 5,430,609 | 7/1995 | Kikinis | 361/687 |
| 5,473,509 | 12/1995 | Schoettl et al. | 361/715 |
| 5,513,070 | 4/1996 | Yie et al. | 361/720 |

FOREIGN PATENT DOCUMENTS

| | | | |
|---|---|---|---|
| 0145647 | 8/1985 | Japan | 257/718 |
| 6085427 | 3/1994 | Japan | 361/720 |

*Primary Examiner*—Gregory D. Thompson
*Attorney, Agent, or Firm*—Skjerven, Morrill, MacPherson, Franklin & Friel; Stephen A. Terrile

[57] ABSTRACT

A thermal transfer circuit is provided for dissipating thermal energy within a portable minicomputer. The thermal transfer circuit is formed during assembly of the personal computer. Specifically, the thermal transfer circuit embodies dual cooling paths for extracting thermal energy from opposing surfaces of an encapsulated integrated circuit. The dual path thermal transfer circuit is formed by drawing the integrated circuit between an upper path heatsink assembly and a lower path heatsink assembly. Thermal connection of heatsink assemblies to corresponding integrated circuit surfaces, either directly or indirectly, allows enhanced dissipation of power-consumptive integrated circuits, such as modern day CPUs. Clamping of the upper and lower heatsink assemblies occurs in equal and opposite force directions normal to opposed integrated circuit surfaces. The normal clamping forces eliminate application of shear force components upon integrated circuit surfaces and the deleterious effects of surface mount lead dislodgment.

20 Claims, 9 Drawing Sheets

INTEGRATED CIRCUIT DUAL COOLING PATHS AND METHOD FOR CONSTRUCTING SAME

BACKGROUND OF THE INVENTION

1. Field of the Invention

This invention relates to a portable computer and more particularly to an improved thermal transfer circuit which uses dual cooling paths for dissipating heat from an integrated circuit mounted within the portable computer.

2. Background of the Relevant Art

A computer system is one which, at a minimum, includes an input/output (I/O) port, a central processing unit (CPU), a read only memory (ROM), a random access memory (RAM), an address bus, a control bus, and a data bus. Depending upon its complexity, a computer system can be classified as a mainframe, a minicomputer or a microcomputer. Mainframe computers, often termed supercomputers, have in many instances today been replaced by smaller, less costly minicomputers. The term minicomputer is therefore used to denote a general purpose personal computer used for computation, process control, word processing, etc. Many workstation minicomputers use graphic-intensive programs and are therefore used for more specialized functions such as computer-aided design (CAD) and computer-aided engineering (CAE). A minicomputer typically employs a printed circuit board (or "motherboard") having separate I/O control, CPU, ROM and RAM integrated circuits arranged upon the motherboard. A microcomputer, on the other hand, generally incorporates I/O control, CPU, ROM and RAM functions on a single monolithic silicon substrate. Depending upon its application, a single chip microcomputer is often denoted as a microcontroller (MCU).

Regardless of the type of computer system used, the CPU often generates large amounts of thermal energy or heat during its operation. Advances in CPU speed and bus throughput have further compounded this problem. Large mainframe computers are usually cooled by forcing cool air or liquid coolant over the CPU heat source. A microcomputer, on the other hand, is generally designed to operate at lower voltages and/or speed, thereby avoiding higher temperature operation. Constrained to application performance demands, a minicomputer, however, must operate at higher speeds and voltages than a microcomputer. Yet, a minicomputer is not afforded the high costs necessary to cool supercomputing mainframes.

Most minicomputers of the desktop variety are thermally managed by forcing ambient air across the motherboard and particularly across the CPU. Forcing air in such a manner requires a fan placed upon the minicomputer chassis and, in some instances, an additional fan placed directly above the CPU. In lieu of or in addition to a fan, many minicomputer manufacturers employ a heatsink upon the CPU. A heatsink is generally made of metal having opposed surfaces, wherein one surface is mostly flat while the other surface includes a plurality of outward-extending fins. The flat surface is thermally bonded to the encapsulated CPU, allowing the fins to project into the airflow stream carried through the minicomputer chassis. A silicon compound is normally used as the thermal bonding agent. The metal fins function similar to a metal radiator in that they remove heat from the thermally bonded, underlying CPU by means of conduction, convection and radiation.

Fans and heatsinks provide a cost effective mechanism for thermally managing thermal energy within many types of minicomputer systems. Fans, however, require power and heatsinks require space. While power and space are generally in abundant supply in desktop minicomputers, portable minicomputers (often termed "laptop computers") have only a limited supply of both power and space. A commercial advantage is achieved by manufacturing portable computers that are both small and lightweight. Portable computers must also operate with power conservation in mind. An operable fan would unduly draw upon the batteries of a portable computer making it unattractive for long periods of battery-operated use. Further, conventional finned heatsinks cannot in most instances fit in the closely spaced region between the motherboard and the portable computer housing.

A need therefore exists for a thermal management system within a portable computer which is both cost effective and operably superior to conventional fans and fin-shaped heatsinks. Thermal management of portable computers has become an even more important consideration with the advent of higher speed CPUs, or CPUs having advanced 32-bit and 64-bit bus structures. As an example, Pentium®-based CPUs generate considerably more thermal energy than predecessor x386 and x486 CPUs. In order to effectively use a Pentium®-based CPU within a portable computer, it becomes necessary that heat be efficiently drawn away from the CPU absent the use of bulky finned heatsinks and power consumptive fans.

Conventional CPU-coupled, finned heatsinks necessary to cool modern day CPUs must be quite large. Portable computers which do not use a cooling fan must therefore employ an even larger heatsink. In small outline portable computers, the CPU-embodied motherboard is spaced too close to the underlying base and overlying keyboard to allow the coupling of an effectively sized, conventionally finned heatsink. As portable computer are commercially downsized, the spacings between the motherboard and underlying base and overlying keyboard are further downsized.

The evolution to higher power, higher speed CPUs within portable computers is constrained by the size and power limitations of the portable computer. In many instances, modern day CPUs operate in excess of 6.0 watts. Such CPUs generate an exorbitant amount of heat which cannot, in all instances, be removed by simply employing a heatsink at one surface of the encapsulated CPU, regardless of the heatsink geometry or configuration. Even if there were enough room between the motherboard and the portable computer housing for a large finned heatsink a heatsink bonded to one surface of the CPU might still be insufficient to cool a modern day CPU. It would therefore be desirable to remove heat from more than one surface of the CPU.

Removal of heat requires direct or indirect thermal contact upon the encapsulated CPU. In portable computer applications, CPUs are generally encapsulated in small outline packages generally referred to as tape carrier packages (TCPs). A TCP is relatively thin compared to pin grid arrays (PGAs) or leaded chip carriers, etc. As such, TCPs are relatively fragile. Undue force upon the TCP can break the encapsulant and/or the inner CPU die. In addition to being frail, a TCP employs fine pitch leads extending from the package for surface bonding to the motherboard. Any shear force upon the TCP can readily dislodge or break the leads at or near the bond locations.

It is therefore necessary to derive a mechanism which effectively cools a modern day CPU mounted within a small outline portable computer. The cooling mechanism, generally referred to as a "thermal transfer circuit", must utilize more than one cooling path. Maximum cooling could be achieved if the thermal transfer circuit utilizes two cooling paths thermally bonded directly or indirectly to opposing surfaces of an encapsulated CPU. The cooling mechanisms of each path must have a low profile configuration to fit between the motherboard and overlying keyboard as well as between the motherboard and underlying portable computer housing. Further, the cooling paths must be capable of thermally contacting, either directly or indirectly, the fragile TCP extensively used in portable computer application. The heatsinks associated with each cooling path must therefore controllably contact the TCP to minimize risk of breaking the CPU and/or leads contacting the CPU to the motherboard.

SUMMARY OF THE INVENTION

The problems outlined above are in large part solved by an improved thermal transfer circuit of the present invention. The thermal transfer circuit operates within the space constraints of a portable minicomputer. Namely, the thermal transfer circuit hereof utilizes dual cooling paths designed to fit between the motherboard and the underlying portable computer housing as well as between the motherboard and overlying keyboard. The thermal transfer circuit purposely relies upon spacings above and below the motherboard to employ respective upper and lower heatsink assemblies. The CPU mounted upon the motherboard is thermally interposed directly between the upper heatsink assembly and the lower heatsink assembly. By clamping the upper and lower heatsinks together about the CPU, dual cooling paths of the present thermal transfer circuit are formed. Importantly, the circuit is formed solely by applying normal forces directly above and below the packaged CPU. Therefore, the present thermal transfer circuit is advantageously used to transfer heat from a fragile, CPU-embodied TCP. The lower and upper heatsink structures are constructed in layers, wherein each layer is added directly above the previous layer in a "top-down" assembly methodology. The ease by which top-down assembly is carried out enhances the manufacturability and repeatability of the present thermal transfer circuit.

The thermal transfer circuit comprises a pair of thermally conductive paths extending along the circuit defined by mechanical couplings or components arranged along the paths. A thermal transfer circuit is therefore one which extends from a thermal (heat) source to a pair of thermal heat sinks. A majority of the heat developed within a portable computer arises from the CPU. Therefore, the CPU represents the thermal source in most instances. The thermal transfer circuit, therefore, according to the present design, extends preferably from the CPU to both upper and lower heatsink assemblies. The thermal transfer circuit can be "tuned" to provide variability in heat expulsion to the upper heatsink relative to the lower heatsink. The thermal impedance of each cooling path can readily be adjusted to optimally disperse heat throughout the portable computer housing. For example, it may be desirable to minimize hot spots at the portable computer base by enhancing the thermal impedance of the lower cooling path while lessening thermal impedance of the upper cooling path. In so doing, a predominant amount of heat is dissipated to the upper heatsink assembly above the motherboard and away from the computer base. Tuning the thermal transfer circuit to maximize the uniformity by which heat from power consumptive, modern day CPUs is dissipated throughout a portable computer is an important feature of the thermal transfer circuit.

The thermal transfer circuit is preferably manufactured in stages simultaneous with assembly of the portable computer itself. Early in the assembly of a portable computer, a computer housing is presented void of a motherboard and the various integrated circuits mounted thereon. The computer housing is configured to receive a lower heatsink assembly which readily mounts upon a specified location within that housing. Thereafter, a CPU-embodied motherboard is placed over the lower heatsink assembly, wherein the CPU is aligned with an upward-facing contact area of the lower heatsink assembly. An upper heatsink assembly is then arranged over the CPU. A downward-facing contact area of the upper heatsink assembly is aligned with the area of the motherboard opposite the side upon which the CPU is mounted. The upper heatsink assembly is then drawn toward the lower heatsink assembly with the CPU and motherboard thermally interposed therebetween. The upper and lower heatsink assemblies are then thermally coupled with the CPU and operate as dual cooling paths of the thermal transfer circuit. The dual cooling paths function to dissipate heat from opposing surfaces of the CPU. Importantly, the upper and lower heatsink assemblies are clamped (i.e., drawn toward one another) in a direction perpendicular to opposing, substantially planar surfaces of the encapsulated CPU. The thermal transfer circuit is thereby formed without incurring any shear force upon the encapsulant and/or leads which extend therefrom.

According to a preferred embodiment, clamping of the upper and lower heatsink assemblies about the encapsulated CPU locally rigidizes the encapsulated CPU (preferably a CPU encapsulated within a TCP) as well as the printed circuit board directly adjacent the CPU. The upper and lower heatsink assemblies are formed by placing the lower heatsink upon the upper, inside surface of the computer housing. Thereafter, layers of structures are added to the resulting upper surface to complete a top-down assembly of the thermal transfer circuit. Threaded screws are placed into passages formed through the completed structure from a convenient, exposed position above the upper and lower heatsink assemblies and interposed CPU-embodied motherboard. The threaded screws are designed to insert directly downward through respective apertures aligned with one another within the assemblies and motherboard. Rotation of the threaded screws from a position directly above and normal to the assemblies and motherboard enhances assembly convenience and repeatability. Placement of screws from a vertical orientation with the screw head extending upward, makes the task of assembly much easier for an assembly operator who must accurately repeat the task throughout the day.

Broadly speaking, the thermal transfer circuit comprises a thermal conduction assembly. The assembly includes an upper heatsink assembly with a downward-facing thermal contact area and a spaced set of upper heatsink apertures arranged about the downward-facing contact area. The thermal conduction assembly further includes a lower heatsink assembly with an upward-facing thermal contact area and a spaced set of lower heatsink apertures arranged about the upward-facing contact area. The lower heatsink apertures are laterally aligned with the upper heatsink apertures to present respective elongated passages. A screw is then inserted into each of the passages to draw the downward-facing contact area toward the upward-facing contact area. Placed between the downward-facing contact area and the upward-facing contact area is a heat source. The heat source preferably comprises an integrated circuit mounted upon a printed circuit board. The printed circuit board, or motherboard, includes printed circuit board apertures formed therethrough in alignment with the elongated passages of the upper and lower heatsink apertures.

The present invention further contemplates a computer. The computer comprises a printed circuit board arranged within the housing of the computer. An integrated circuit is also included having opposed first and second sides. The first side of the integrated circuit is coupled to the printed circuit board. An upper heatsink assembly is arranged across the surface of the printed circuit board directly opposite the surface on which the integrated circuit is coupled. A lower heatsink assembly is arranged across the second side of the integrated circuit. The printed circuit board, the upper heatsink assembly, and the lower heatsink assembly each have an aperture laterally aligned with one another to present a passage extending through the stacked arrangement. The passage is adapted for receiving a screw rotatably inserted therein to draw the upper and lower heatsink assemblies toward one another in a direction normal to the first and second sides of the integrated circuit. The screw placed within each passage not only draws the assemblies in a normal direction to opposed sides of the integrated circuit but, in so doing, also presents a thermal transfer circuit having dual cooling paths. The normal-directed clamping force compresses a Poron foam by a predetermined amount to maximize contact between the two abutting surfaces. Compression of the Poron foam helps compensate for irregularity in surface contour of the abutting surfaces while maintaining maximum contact area.

The present invention still further contemplates a method for constructing a thermal conduction path upon an integrated circuit. The method comprises the steps of mounting one surface of an integrated circuit upon a printed circuit board, whereby an opposing surface of the integrated circuit remains exposed. Next, the exposed surface of the integrated circuit is forwarded in a normal direction upon an upward-facing contact area of a lower heatsink assembly. Next, a downward-facing contact area of an upper heatsink assembly is directed upon the printed circuit board surface directly opposite the surface upon which the integrated circuit is mounted. The integrated circuit and the printed circuit board adjacent the integrated circuit are then secured between the upper heatsink assembly and the lower heatsink assembly by screws inserted from a position above the assemblies into apertures extending through the assemblies and through the printed circuit board arranged therebetween. Each screw is rotated to draw the upper heatsink assembly against the printed circuit board while simultaneously drawing a lower heatsink assembly against the integrated circuit.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
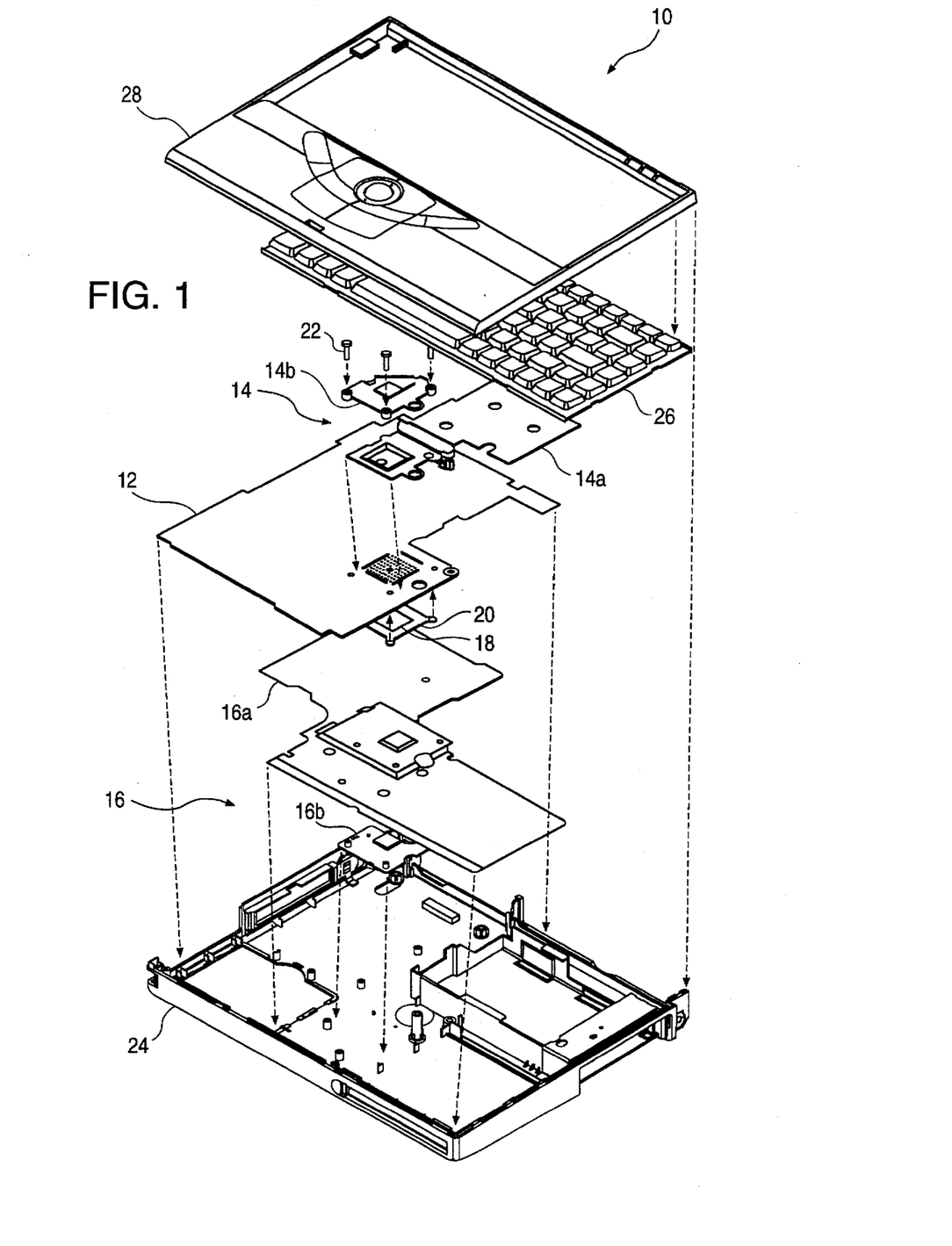
FIG. 1 is an exploded, top-side isometric view of a portable computer having a thermal transfer circuit of the present invention incorporated therein.

Turning now to the drawings, FIG. 1 is an exploded, top-side isometric view of a portable computer 10. Portable computer 10 is herein defined as a minicomputer-type digital computer having numerous integrated circuits arranged upon a printed circuit board (PCB) or motherboard 12. PCB 12 is also used to structurally house hard drives, floppy drives, and various other peripheral units normally associated with an AT-compatible minicomputer system. PCB 12 is shown interposed between upper and lower heatsink assemblies 14 and 16, respectively. PCB 12, upper heatsink assembly 14 and lower heatsink assembly 16 are assembled to provide a thermal transfer circuit having dual cooling paths. The transfer circuit expels heat away from an integrated circuit 18 partially housed within a lead guard 20. An upper spreader plate 14a of upper heatsink assembly 14 contacts the surface of PCB 12 directly opposite the surface upon which integrated circuit 18 and lead guard 20 connect. Likewise, lower spreader plate 16a contacts a downward-facing surface of integrated circuit 18. Upper and lower spreader plates 14a and 16a are retained by respective upper and lower retainers 14b and 16b. Screws 22 are used to draw upper and lower retainers 14b and 16b together in a clamping fashion.

Integrated circuit 18 is a heat source, and preferably is a CPU encapsulated within a TCP. Upper and lower spreader plates 14a and 16a are thermally mounted indirectly and directly, respectively, against opposing surfaces of the TCP-encapsulated CPU.

The thermal transfer circuit is assembled by applying normal forces to the opposing surfaces of the CPU during assembly of computer 10. Computer 10 is thereby manufactured by forming the thermal transfer circuit within the lower casing or housing 24 prior to attachment of keyboard 26 and palm rest 28 upon lower housing 24.

The steps undertaken to assemble the dual path thermal transfer circuit during manufacture of portable computer 10 is best described in reference to FIGS. 2-8. The sequence begins with the illustration of FIG. 2 having an upper, inner surface of lower housing 24 configured to receive lower retainer 16b. The inner surface of housing 24 includes an upward-extending post 30 which serves to guide a partial eyelet 32 along one side of post 30. When seated, lower retainer 16b extends along a plane substantially parallel to the inner surface of housing 24. A foam material 34 is secured upon a stamped region 36 of lower retainer 16b. Region 36 is stamped into the sheet metal material comprising lower retainer 16b according to commonly known metal forming techniques. The sheet metal material must be sufficiently rigid to serve as a retainer and to allow formation of upward extending, threaded bosses 42 thereon. A suitable thickness for the sheet metal is chosen to be approximately 1.0 mm. Foam material 34 comprises any thermally insulative, closed cell foam element having a highly linear spring rate and lower memory, even at temperatures within the operating range of modern day CPUs. A suitable foam material 34 can be obtained from 3M Corporation under the tradename PORON®. Foam material 34 preferably includes an adhesive on one side, preferably the side which contacts region 36.

Figure 2:
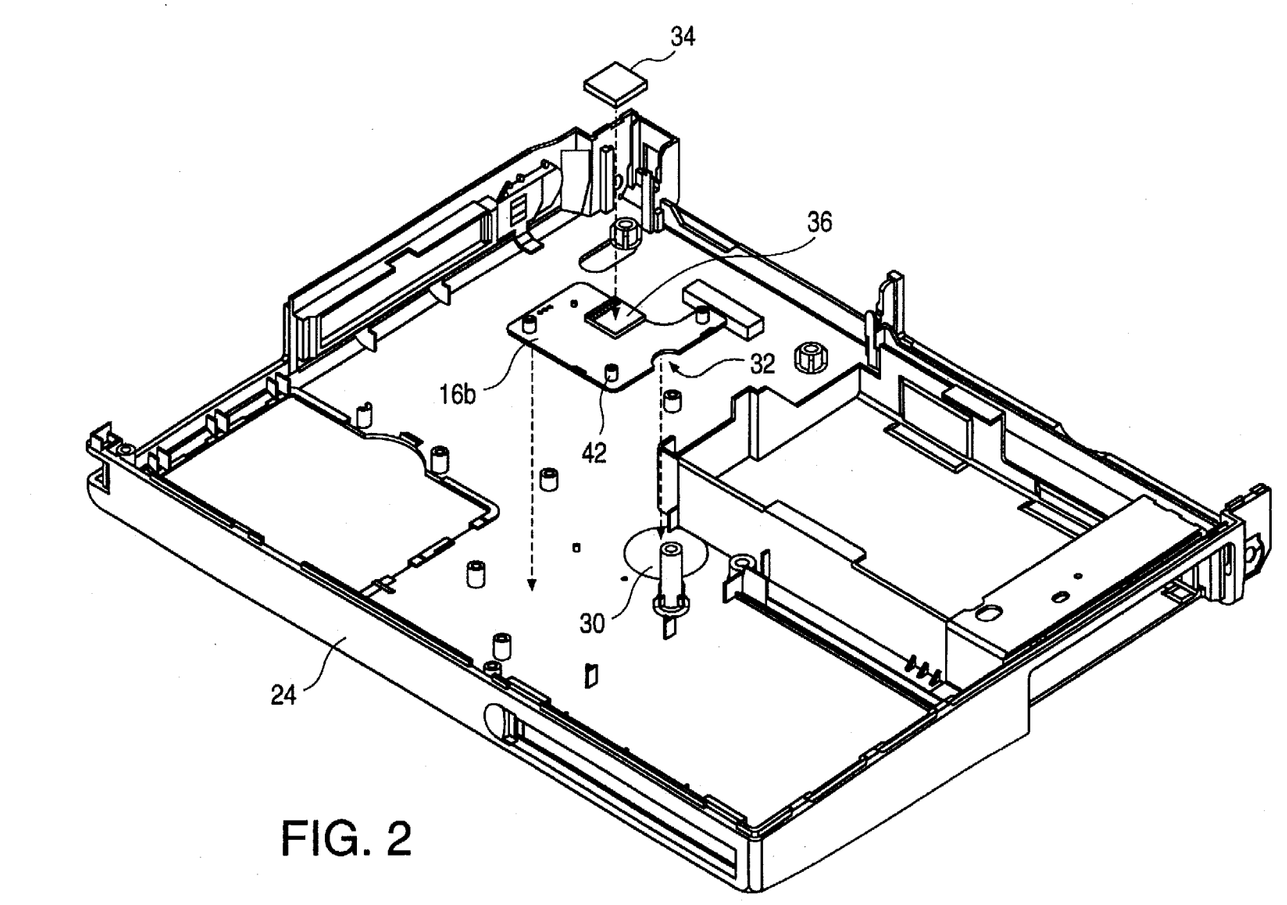
FIG. 2 is a top-side isometric view of a portable computer housing configured to receive a lower retainer of a lower heatsink assembly.
Figure 3:
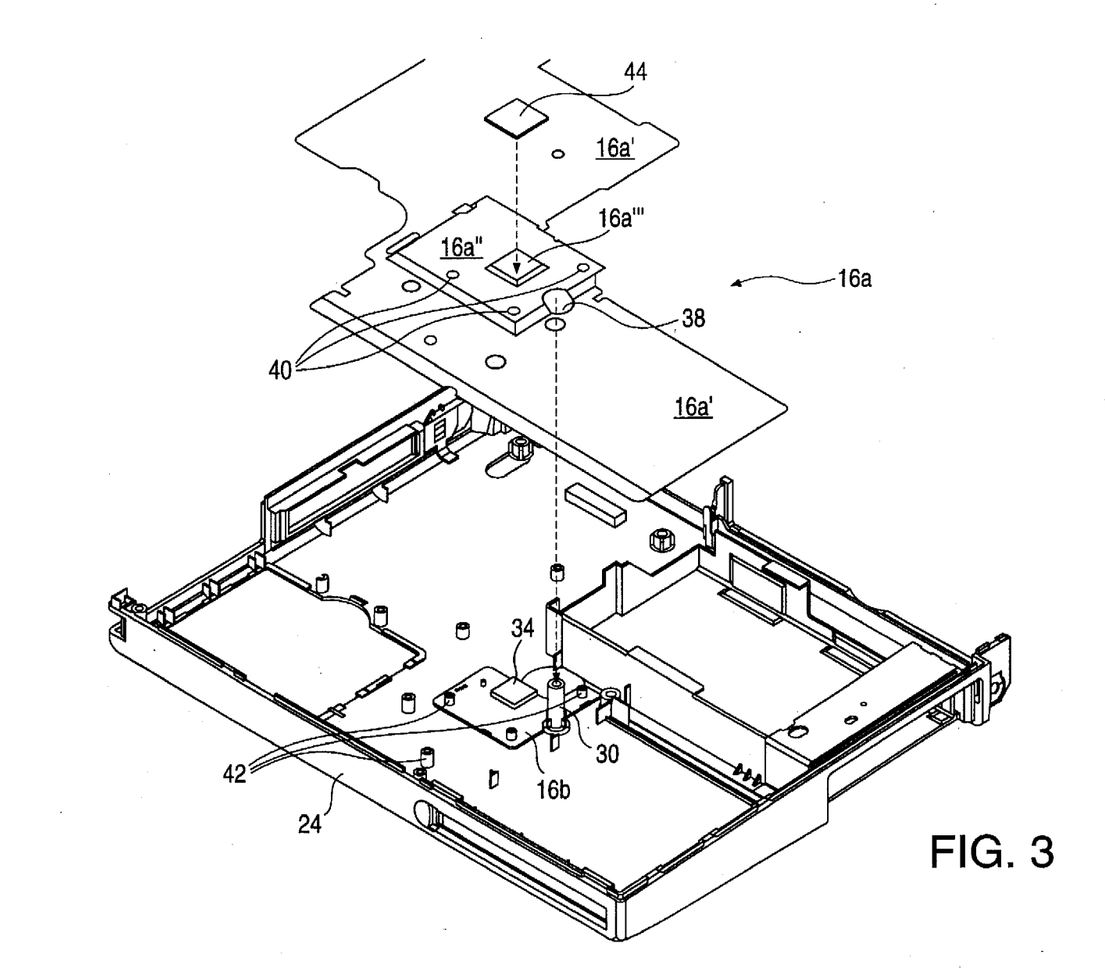
FIG. 3 is a top-side isometric view of a lower spreader plate of the lower heatsink assembly placed over the lower retainer in a step subsequent to FIG. 2.

Referring now to FIG. 3, an isometric view of an assembly step subsequent to that of FIG. 2 is shown. In particular, FIG. 3 illustrates lower spreader plate 16a drawn over lower retainer 16b as well as other regions across the inner surface of lower housing 24. Lower spreader plate 16a is made from a single piece of aluminum sheet metal stamped into a three tier configuration. The lowermost tier is denoted as reference number 16a', the intermediate tier is referenced as 16a", and the upper most tier is referenced as 16a'''. Tier 16a' is lowered from tier 16a" to allow clearance from an overlying PCB (shown in FIGS. 4–6). Between tiers 16a' and 16a" is an eyelet 38 through which post 30 extends during assembly. Tier 16a" includes three eyelets 40 through which bosses 42 extend. Eyelets 40 are spaced from each other in lateral alignment with bosses 42 arranged about the outer periphery of retainer 16b. Tier 16a''' extends upward, leaving a recess at the bottom surface of spreader plate 16a in registry of the outer periphery of foam pad 34. Accordingly, eyelets 38 and 40, and the lower side recess allow accurate alignment of lower spreader plate 16a' to lower retainer 16b as well housing 24.

Assembly of lower spreader plate 16a upon retainer 16b within housing 24 is completed by securing a thermally conductive material 44 upon the exposed surface of the TCP. Member 44 can be made of any thermally conductive material, a suitable material being Chomerics A274 obtainable from Chomerics, Inc. of Woburn, Mass.

Figure 4:
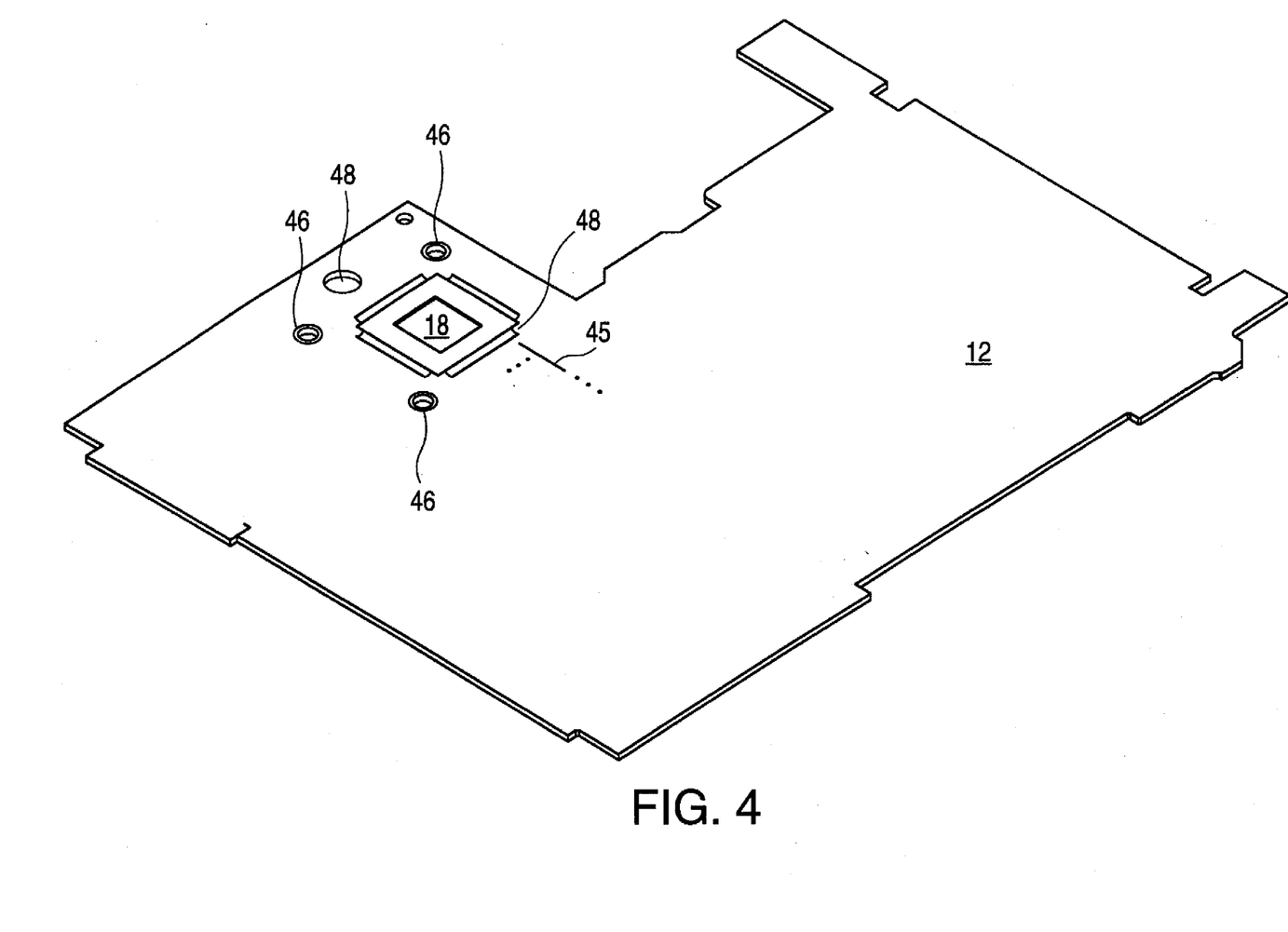
FIG. 4 is a bottom-side isometric view of a printed circuit board, or motherboard, having an encapsulated integrated circuit surface mounted thereon.

Referring now to FIG. 4, a bottom-side isometric view of PCB 12 is shown. PCB 12 is formed according to well-known techniques by either the subtractive process, or the additive process, from rigid copper-clad, epoxy-impregnated glass fiber laminate. PCB 12 includes one or more layers of conductive trace elements or printed conductors formed thereon using well known lithography techniques. FIG. 4 illustrates a printed conductor 45 adapted to receive one lead of a plurality of leads 48 extending from an integrated circuit encapsulated within a TCP. Integrated circuit 18 is connected to the lower surface of PCB 12 using die attach epoxy, and a lead of leads 48 is surface mounted to printed conductor 45 using, for example, solder reflow techniques. Eyelets 46 are formed in alignment with the previously described eyelets 40 and bosses 42. Eyelets 46 are formed according to plated-through-hole technology having electroless copper arranged throughout the inner surface of eyelet 46. A large eyelet 48 is aligned with eyelet 38 and post 30, wherein eyelets 46 and 48 allow precise alignment of PCB 12 over lower spreader plate 16a and within housing 24.

Figure 5:
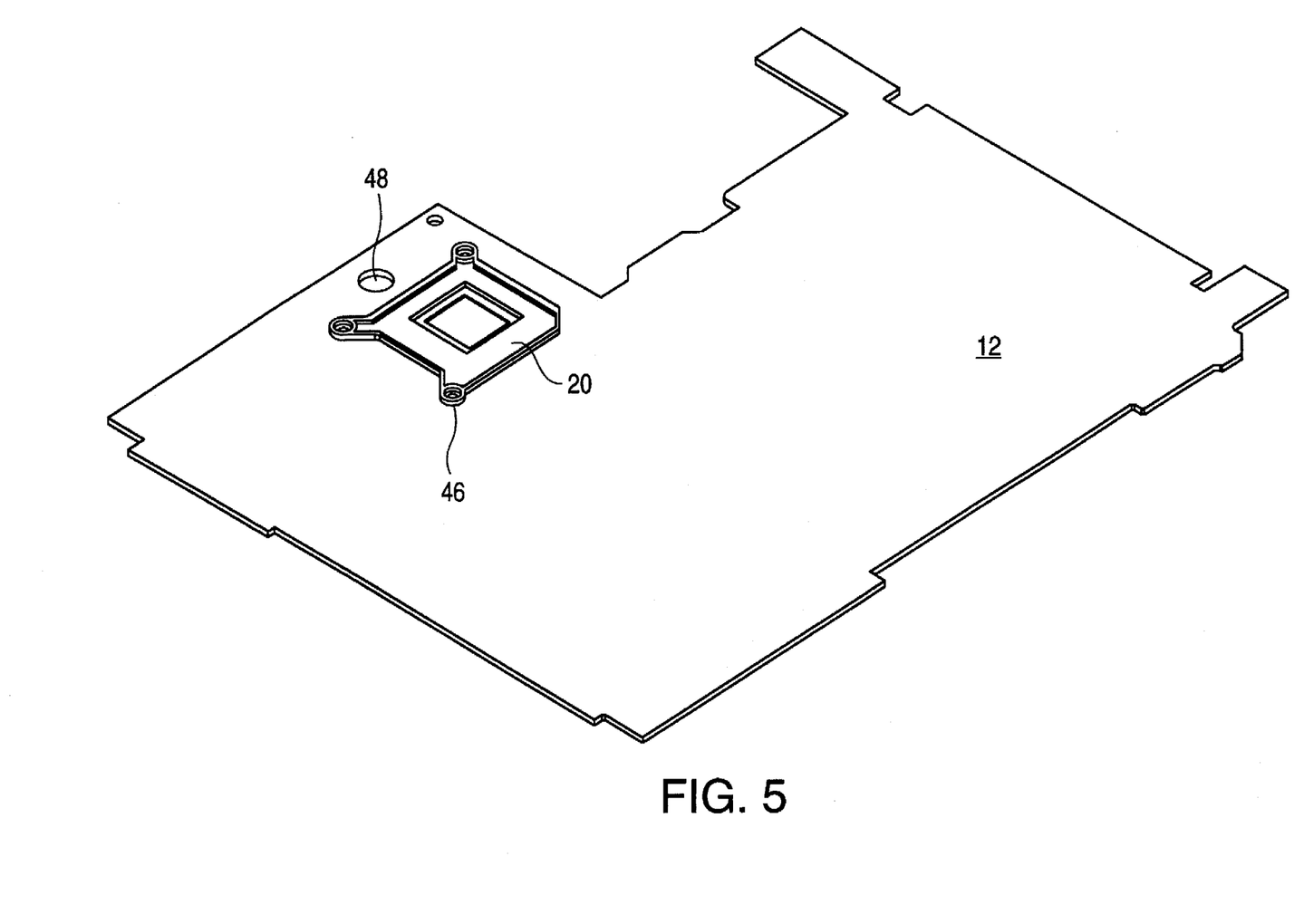
FIG. 5 is a bottom-side isometric view of the printed circuit board having a lead guard mounted over the integrated circuit in a step subsequent to FIG. 4.

FIG. 5 illustrates a lead guard 20 made of conformable plastic mounted about the periphery and over the leads of TCP-encapsulated integrated circuit 18. Lead guard 20 includes three protrusions 47. Protrusions 47 are dimensioned to snap fit into the plated holes of eyelets 46 to secure lead guard 20 over the outer portion of integrated circuit 18 and, more importantly, over leads 48. The use and structure of lead guards are fairly well-known in the industry, and are generally used to protect the leads of surface mount components. The lead guard extends over the lead to prevent accidental contact of fine-pitch leads and dislodgment thereof.

Figure 6:
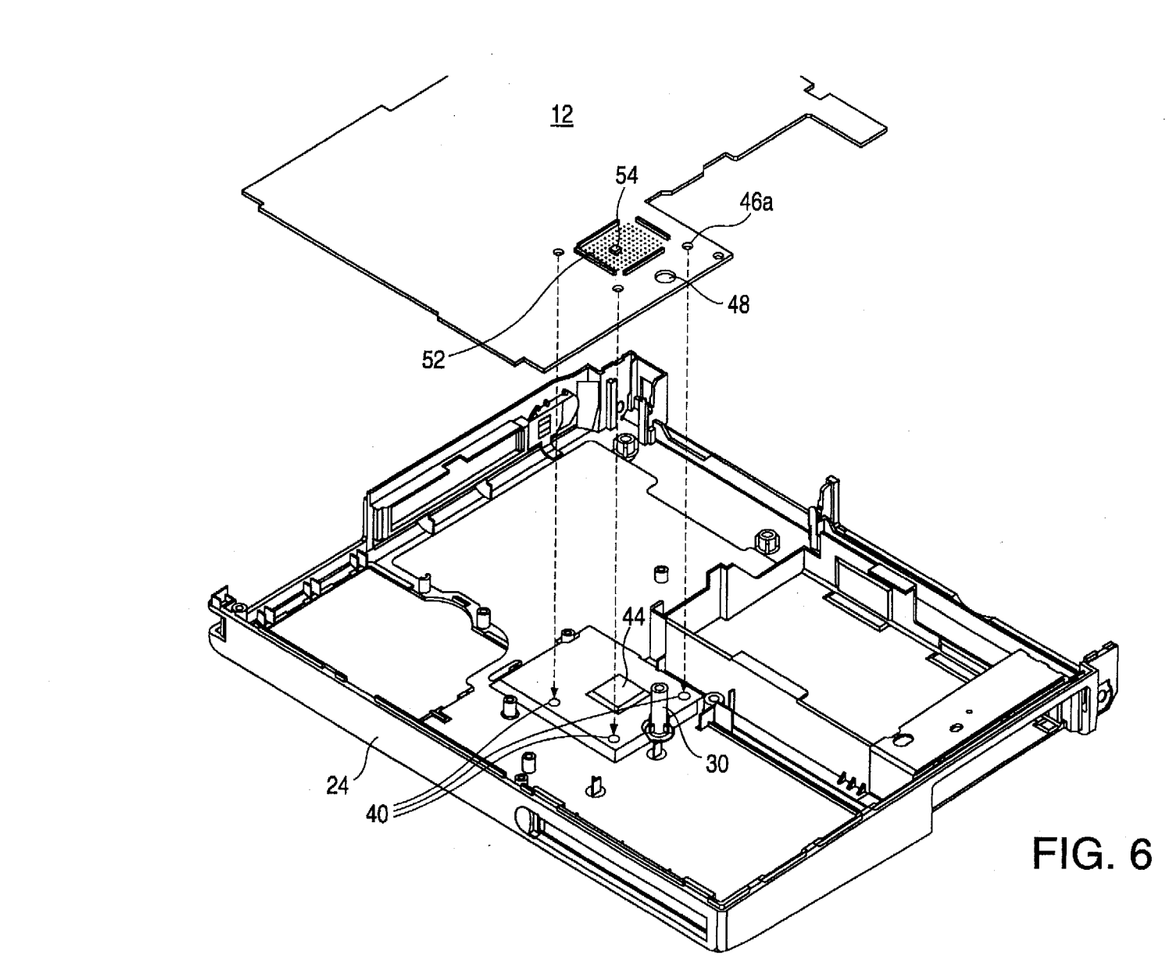
FIG. 6 is a top-side isometric view of the assembled printed circuit board of FIG. 5 placed over the lower spreader plate of the lower heatsink assembly in an assembly step subsequent FIGS. 3 and 5.

Turning now to FIG. 6, a top-side isometric view of an assembly step subsequent to that of FIG. 3 is shown. Specifically, FIG. 6 illustrates the top surface of PCB 12 after the steps of FIGS. 4 and 5 have been completed on the bottom side surface of PCB 12. Lead guard 20, shown in FIG. 5, includes an aperture 46a through each protrusion 47 which aligns with eyelets 40 and bosses 42. Eyelets 46 and eyelet 48 align with eyelet 40 and post 30. A plurality of vias 52 are formed through PCB 12 using plated-through-hole technology. Vias 52 extend between opposing surfaces of PCB 12, wherein one end abuts against the thermally conductive, die attach epoxy placed on the backside surface of integrated circuit 18. The other end of each via 52 extends upward and substantially flush with the upper surface of PCB 12. A temperature sensor 54 can, if desired, be placed against one end of a set of vias 52 to allow electronic reading of temperatures associated with integrated circuit 18. Assembly of PCB 12 within housing 24 provides registry and contact of integrated circuit 18 arranged at the bottom surface of PCB 12 against thermal conductive material 44. Lead guard 20 extends only about the periphery of integrated circuit 18, thereby allowing an exposed surface of said circuit to contact with thermal conductive material 44. Accordingly, thermal conductive material 44, in combination with lower spreader plate 16a provides one (i.e., lower) cooling path of the present dual cooling path thermal transfer circuit.

Figure 7:
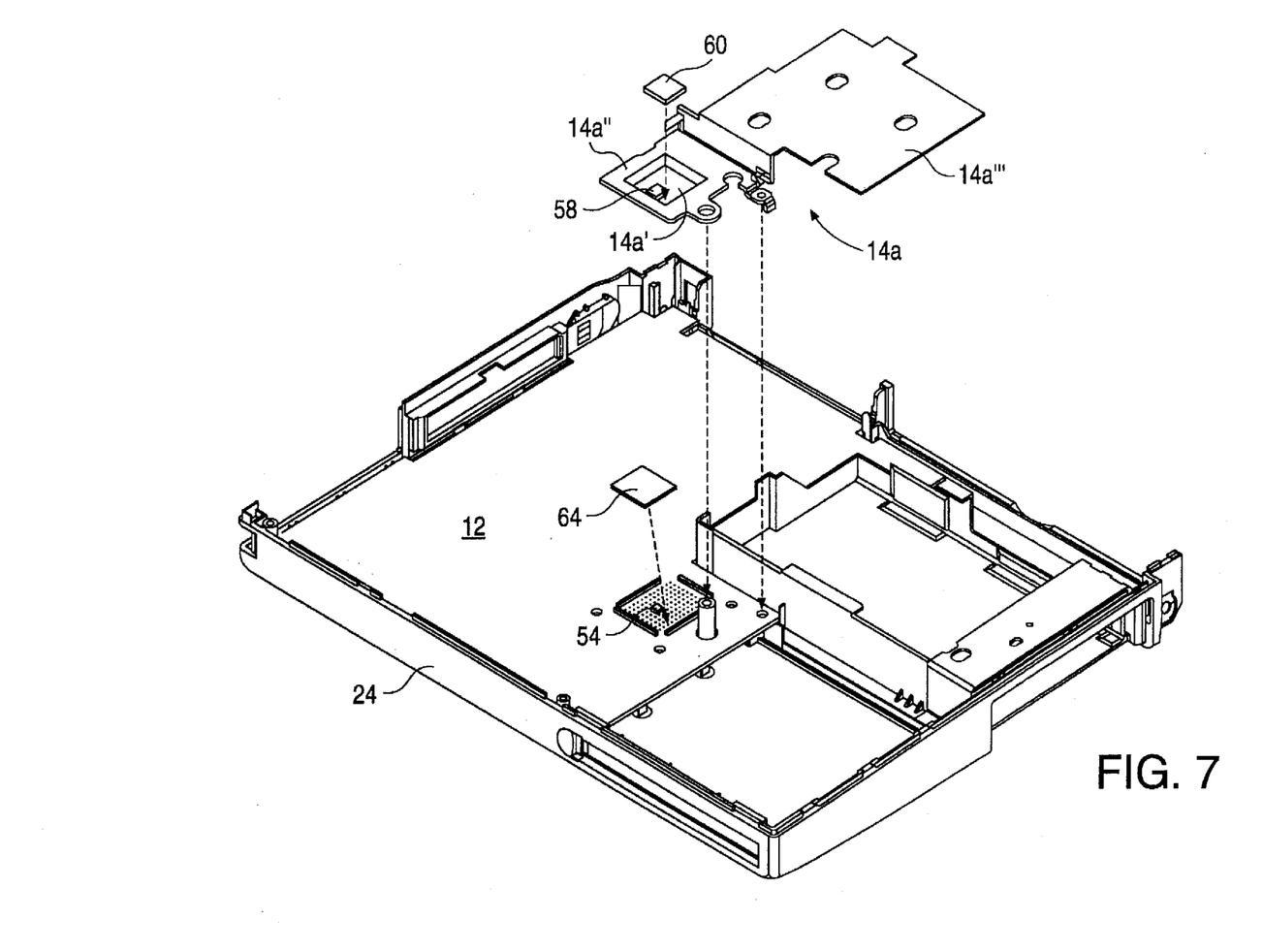
FIG. 7 is a top-side isometric view of an upper spreader plate placed over a portion of the printed circuit board in an assembly step subsequent to FIG. 6.

Turning now to FIG. 7, a top-side isometric view of an assembly step subsequent to FIG. 6 is shown. In particular, FIG. 7 illustrates upper spreader plate 14a placed onto the upper surface of PCB 12. Upper spreader plate 14a comprises two portions or tiers of dissimilar elevations. A lower tier 14a' includes a stamped area, having a lower surface which extends downward beyond the lower surface of tier 14a". Tier 14a' also includes an opening 58 which aligns with and partially receives temperature sensor 54.

Coupled to tier 14a" of upper spreader plate 14a is another portion entitled 14a'''. Portion 14a''', similar to plate 14a, is made of aluminum sheet metal. Portion 14a''' is, however, preferably thinner than portions 14a' and 14a". Suitable thicknesses or portions 14a''' and 14a' (or 14a) are 0.5 mm and 1.5 mm, respectively.

Placed on the upper surface of stamped tier 14a' is a thermally insulative foam member 60, similar in composition to foam member 34. Alternatively, foam member 60 may be secured, if desired, to upper retainer 14b, at the downward protruding region of retainer 14b. Preferably, member 60 includes an adhesive on one surface for securement against stamped area 14a'.

Figure 8:
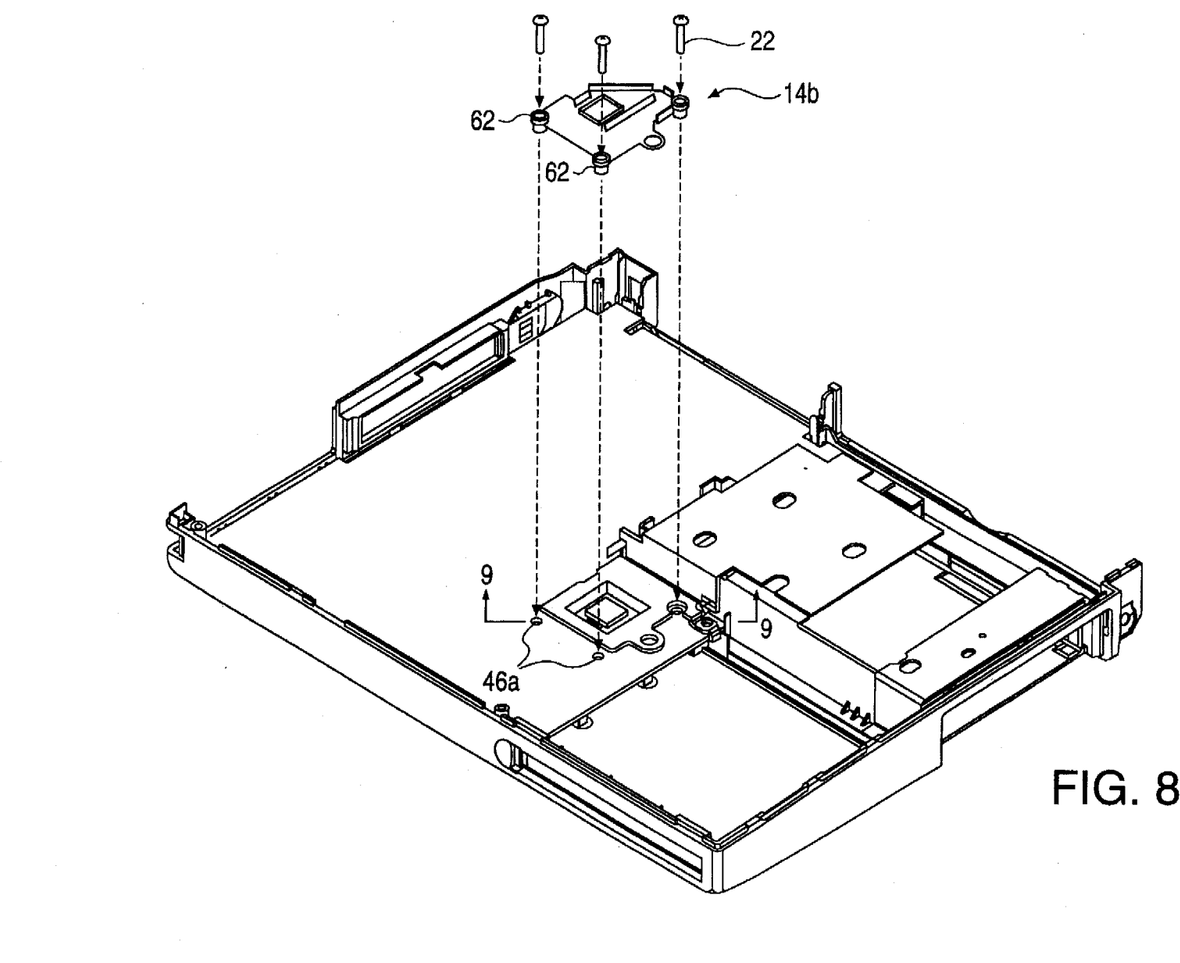
FIG. 8 is a top-side isometric view of an upper retainer placed over the upper spreader place with screws inserted therein to thermally couple and secure the upper and lower heatsink assemblies about the encapsulated integrated circuit.

Referring to FIG. 8, an assembly step subsequent to step 7 is shown. FIG. 8 illustrates upper retainer 14b having eyelets or apertures 62 arranged over corresponding apertures 46a. Upper retainer 14b similar to lower retainer 14a, is made of stamped sheet metal of equivalent thickness. Referring to FIGS. 6 and 7, a thermally conductive material 64 (shown in FIG. 7) is placed over vias 52 prior to placement of upper spreader plate 14a. Thickness of thermal conductive material 64 can vary depending upon the amount of desired thermal impedance of the upper cooling path. More specifically, material 64 thickness can be tuned relative to the thickness of material 44 shown in FIG. 6. Utilizing a thinner material 64 than material 44 allows a greater amount of heat dissipation to the upper cooling path than the lower cooling path. For example, varying the thicknesses of materials 64 and 44 can provide a tuning feature advantageously used to disseminate heat according to a desired pattern both above and below PCB 12. For example, a need may arise for drawing more heat above rather than below PCB 12 in order to avoid hot spots upon the bottom housing 24. In such instances, material 64 can be reduced in thickness relative to material 44 to tune the thermal transfer circuit to re-direct heat away from the bottom housing 24 and toward keyboard 26.

Figure 9:
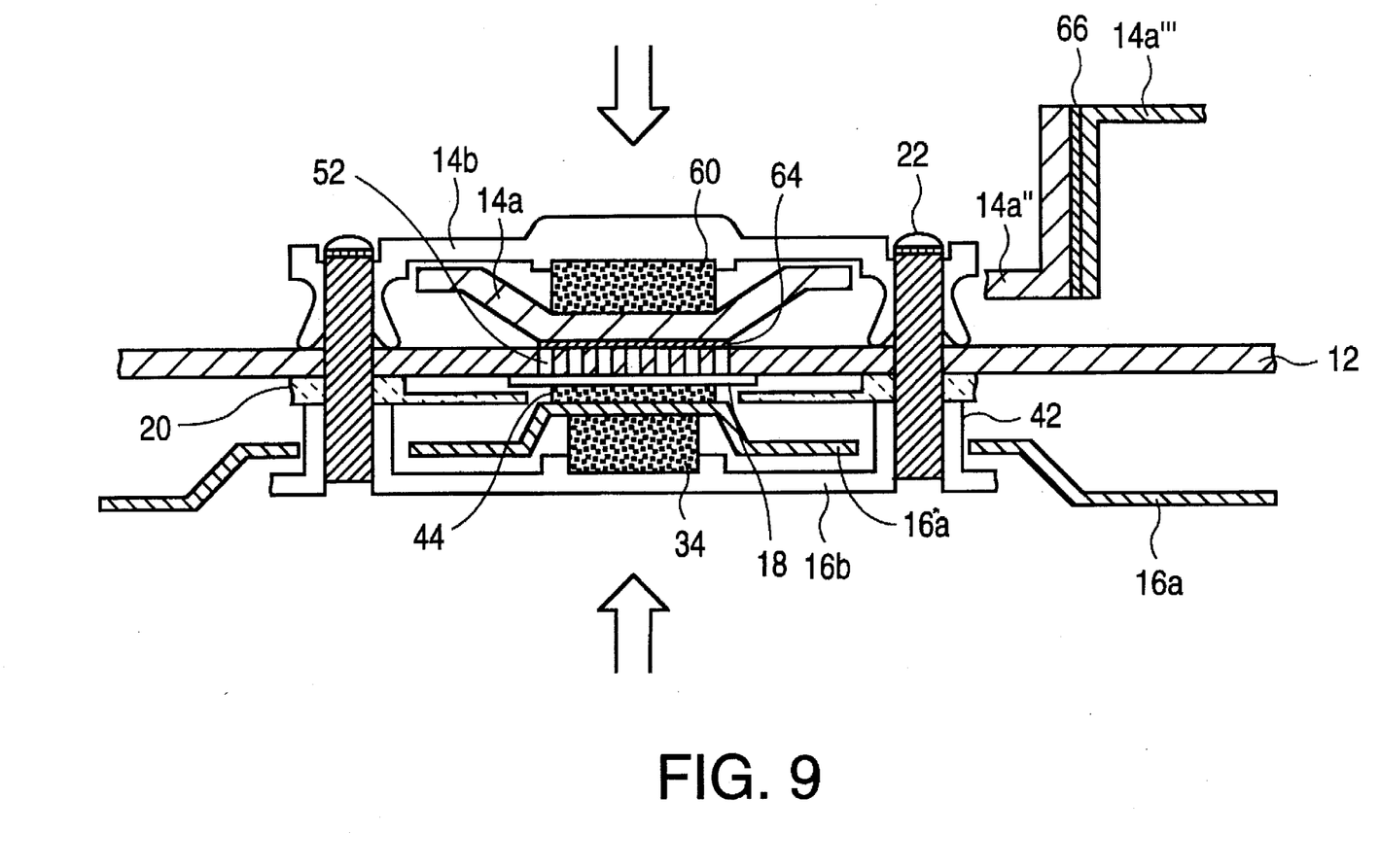
FIG. 9 is a cross-sectional view along plane 9—9 of FIG. 8 illustrating the thermal transfer circuit of the present invention assembled according to the steps of FIGS. 2-8.

Turning now to FIG. 9, a cross-sectional view along plane 9 of FIG. 8 is shown. In particular, FIG. 9 illustrates the dual path thermal transfer circuit in its final assembled form, assembled according to the steps of FIGS. 2–8. Absent lower housing 24, FIG. 9 depicts screws 22 fully seated within the threaded bosses 42 of lower retainer 16b. Screws 22 thereby draw upper and lower retainers 14a and 16b together, while also drawing foam member 60 and upper spreader plate 14a toward foam member 34 and lower spreader plate 16a. Sufficient rotation of screws 22 allows an optimal normal force to be applied upon the upper surface of PCB 12 via thermal conductive material 64 simultaneous with an equal and opposite, optimal normal force applied upon one surface of integrated circuit 18 via thermal conductive material 44. Portion 14a''' is thermally attached via thermal adhesive 66 to lower portion 14a''. In addition to adhesive, a mechanical attachment member may also be used to formulate the connection.

It will be appreciated to those skilled in the art having the benefit of this disclosure that this invention is capable of applications with portable computers, and specifically with advanced CPUs which operate at high processing speeds using enhanced 32-bit or higher bus structures. Furthermore, it is to be understood that the form of the invention shown and described is to be taken as various exemplary preferred embodiments. Specifically, nomenclature for upper and lower heatsink assemblies is merely for descriptive purposes and does not necessarily limit the assembly to an upper and lower vertical orientation with respect to one another. More particularly, depending upon the orientation of the PCB and integrated circuit, the assemblies can be laterally spaced in a horizontal orientation indicative of left and right heatsink assemblies, and associated spreader plates and retainers. It is intended that the following claims be interpreted to embrace all such modifications and changes and, accordingly, the specification and drawings are to be regarded in an illustrative rather than a restrictive sense.

What is claimed is:

1. A system for cooling a heat source, comprising:
    a printed circuit board having a plurality of plated vias extending therethrough;
    a heat source having opposed first and second sides, said first side is adapted for connection to the printed circuit board in thermal contact with a first end of the plated vias;
    an upper heatsink assembly thermally connected to a second end of said plated vias, opposite the first end;
    a lower heatsink assembly thermally connected to the second side of said heat source; and
    a compliant, thermally conductive material placed between the second end of said vias and said upper heatsink.

2. The system as recited in claim 7, wherein said heat source comprises an integrated circuit.

3. The system as recited in claim 7, wherein said heat source comprises an encapsulated microprocessor integrated circuit.

4. The system as recited in claim 3 wherein said system is located within a computer system.

5. A system for cooling a heat source, comprising:
    a printed circuit board having a plurality of plated vias extending therethrough;
    a heat source having opposed first and second sides, said first side is adapted for connection to the printed circuit board in thermal contact with a first end of the plated vias;
    an upper heatsink assembly thermally connected to a second end of said plated vias, opposite the first end;
    a lower heatsink assembly thermally connected to the second side of said heat source; and
    a compliant, thermally conductive material placed between the second side of said heat source and said lower heatsink.

6. The system as recited in claim 5, wherein said heat source comprises an integrated circuit.

7. The system as recited in claim 5, wherein said heat source comprises an encapsulated microprocessor integrated circuit.

8. The system as recited in claim 7 wherein said system is located within a computer system.

9. A system for cooling a heat source, comprising:
    a printed circuit board having a plurality of plated vias extending therethrough;
    a heat source having opposed first and second sides, said first side is adapted for connection to the printed circuit board in thermal contact with a first end of the plated vias;
    an upper heatsink assembly thermally connected to a second end of said plated vias, opposite the first end;
    a lower heatsink assembly thermally connected to the second side of said heat source; and
    wherein said upper heatsink assembly includes
        an upper spreader plate configured to extend across the second end of said plated vias; and
        an upper retainer configured to extend across a portion of the upper plate, said upper retainer having a plurality of apertures spaced about the periphery of the upper retainer.

10. The system as recited in claim 9, further comprising a screw rotatably inserted into each of said apertures to reciprocally draw said upper retainer against said upper plate and, in response thereto, to draw said upper plate thermally against the second end of said plated vias.

11. The system as recited in claim 9, further comprising a compliant, thermally insulative material placed between said upper plate and said upper retainer.

12. The system as recited in claim 9, wherein said heat source comprises an integrated circuit.

13. The system as recited in claim 9, wherein said heat source comprises an encapsulated microprocessor integrated circuit.

14. The system as recited in claim 13 wherein said system is located within a computer system.

15. A system for cooling a heat source, comprising:
a printed circuit board having a plurality of plated vias extending therethrough;
a heat source having opposed first and second sides, said first side is adapted for connection to the printed circuit board in thermal contact with a first end of the plated vias;
an upper heatsink assembly thermally connected to a second end of said plated vias, opposite the first end; and
A lower heatsink assembly thermally connected to the second side of said heat source;
wherein said lower heatsink assembly includes
a lower spreader plate configured to extend across the second side of said heat source; and
a lower retainer configured to extend across a portion of the lower plate, said lower retainer having a plurality of apertures spaced about the periphery of the lower retainer.

16. The system as recited in claim 15, further comprising a screw rotatably inserted into each of said apertures to reciprocally draw said lower retainer against said lower plate and, in response thereto, to draw said lower plate thermally against the second side of said heat source.

17. The system as recited in claim 15, further comprising a compliant, thermally insulative material placed between said lower plate and said lower retainer.

18. The system as recited in claim 15, wherein said heat source comprises an integrated circuit.

19. The system as recited in claim 15, wherein said heat source comprises an encapsulated microprocessor integrated circuit.

20. The system as recited in claim 19 wherein said system is located within a computer system.

* * * * *